(12) United States Patent
Cho et al.

(10) Patent No.: US 12,713,706 B2
(45) Date of Patent: Aug. 18, 2026

(54) SEMICONDUCTOR DEVICE

(71) Applicant: Samsung Electronics Co., Ltd., Suwon-si (KR)

(72) Inventors: Yongeun Cho, Suwon-si (KR); Kibum Kim, Suwon-si (KR); Seonkyeong Kim, Suwon-si (KR); Hayoung Kim, Suwon-si (KR); Hyunjeong Roh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 407 days.

(21) Appl. No.: 18/475,881

(22) Filed: Sep. 27, 2023

(65) Prior Publication Data

US 2024/0203977 A1 Jun. 20, 2024

(30) Foreign Application Priority Data

Dec. 20, 2022 (KR) ........................ 10-2022-0179345
May 23, 2023 (KR) ........................ 10-2023-0066060

(51) Int. Cl.
*H10D 89/60* (2025.01)
*H10D 89/10* (2025.01)
*H10W 20/20* (2026.01)

(52) U.S. Cl.
CPC ........... *H10D 89/611* (2025.01); *H10D 89/10* (2025.01); *H10D 89/921* (2025.01); *H10D 89/931* (2025.01); *H10W 20/20* (2026.01)

(58) Field of Classification Search
CPC .... H10D 89/921; H10D 89/611; H10D 89/10; H10D 89/60; H10D 89/601;
(Continued)

(56) References Cited

U.S. PATENT DOCUMENTS 5,535,084 A 7/1996 Nakayama
2007/0109832 A1 5/2007 Hou et al.
(Continued)

FOREIGN PATENT DOCUMENTS

KR 2015/0073861 A 7/2015
KR 2017/0047998 A 5/2017
(Continued)

OTHER PUBLICATIONS

Ehsan Nazarzadeh Zare et al., 'Nanoadsorbents based on conducting polymer nanocomposites with main focus on polyaniline' *Environmental Research*, vol. 162, Apr. 2018, pp. 173-195.
(Continued)

*Primary Examiner* — Alia Sabur
(74) *Attorney, Agent, or Firm* — Harness, Dickey & Pierce, P.L.C.

(57) ABSTRACT

A semiconductor device may include a substrate including a Keep-Out Zone (KOZ) and a layout finishing cell region, a through silicon via (TSV) penetrating the substrate and surrounded by the KOZ; an ESD diode on an upper surface of the substrate, a driver circuit, gate structures, and metal wirings electrically connecting the TSV, the ESD diode, and the driver circuit. The layout finishing cell region may surround the KOZ and the ESD diode. The driver circuit may be adjacent to and outside the layout finishing cell region. The substrate may include active regions extending from an end inside the layout finishing cell region. The gate structures may intersect the active regions to form semiconductor components. The driver circuit may include at least some of the semiconductor components.

20 Claims, 13 Drawing Sheets

(58) Field of Classification Search
CPC . H10D 89/931; H10D 84/998; H10W 20/212; H10W 20/20; G06F 30/39
See application file for complete search history.

(56) References Cited

U.S. PATENT DOCUMENTS

| | | | | |
|---|---|---|---|---|
| 2007/0157151 | A1 | 7/2007 | Kim | |
| 2011/0095367 | A1* | 4/2011 | Su | G06F 30/39 257/E21.409 |
| 2011/0260318 | A1* | 10/2011 | Eisenstadt | H03K 19/02 257/E23.06 |
| 2012/0182650 | A1 | 7/2012 | Chi | |
| 2012/0254817 | A1* | 10/2012 | Sherlekar | G06F 30/39 716/119 |
| 2012/0304142 | A1 | 11/2012 | Morimoto et al. | |
| 2014/0091478 | A1* | 4/2014 | Furuta | H10W 20/20 257/774 |
| 2014/0145266 | A1* | 5/2014 | Ishikawa | H10D 89/921 257/355 |
| 2014/0245248 | A1 | 8/2014 | Yang et al. | |
| 2015/0179568 | A1 | 6/2015 | Chang et al. | |
| 2016/0233134 | A1 | 8/2016 | Lim et al. | |
| 2017/0116366 | A1 | 4/2017 | Seo et al. | |
| 2019/0214377 | A1 | 7/2019 | Ryu et al. | |
| 2019/0220570 | A1 | 7/2019 | Barowski et al. | |
| 2020/0212032 | A1 | 7/2020 | Duesman et al. | |
| 2020/0335502 | A1* | 10/2020 | Mohan | H10D 62/127 |
| 2021/0098987 | A1* | 4/2021 | Walimbe | G06F 30/30 |
| 2021/0209284 | A1 | 7/2021 | Li et al. | |
| 2021/0305678 | A1* | 9/2021 | Huang | H01Q 1/2283 |
| 2021/0350061 | A1 | 11/2021 | Sreenivasan et al. | |
| 2022/0012402 | A1 | 1/2022 | Hu et al. | |
| 2022/0130737 | A1 | 4/2022 | Kim et al. | |
| 2022/0367439 | A1 | 11/2022 | Kang | |
| 2023/0061812 | A1* | 3/2023 | Yu | H01Q 1/2283 |
| 2023/0307386 | A1* | 9/2023 | Zhong | H10D 89/811 |

FOREIGN PATENT DOCUMENTS

| | | | |
|---|---|---|---|
| KR | 2019/0085588 | A | 7/2019 |
| KR | 2022/0055075 | A | 5/2022 |
| KR | 2022/0153382 | A | 11/2022 |
| WO | WO-2012/077280 | A1 | 6/2012 |

OTHER PUBLICATIONS

Sai Surya Kiran Pentapati et al., ‘Pin-3D: A Physical Synthesis and Post-Layout Optimization Flow for Heterogeneous Monolithic 3D ICs’ *2020 IEEE/ACM International Conference On Computer Aided Design* (*ICCAD*), Nov. 2020, pp. 1-9.

Ali Taghizadeh et al., ‘Conductive polymers in water treatment: A review’ *Journal of Molecular Liquids*, vol. 312, Aug. 2020, 113447.

Extended European Search Report dated Apr. 11, 2024 for corresponding European Patent Application No. 23207134.0.

Extended European Search Report dated Apr. 29, 2024 for corresponding European Patent Application No. 23208916.9.

Office Action dated May 27, 2026 issued in the related U.S. Appl. No. 18/482,680.

* cited by examiner

A

SEMICONDUCTOR DEVICE

CROSS-REFERENCE TO RELATED APPLICATION(S)

This application claims benefit of priority to Korean Patent Application Nos. 10-2022-0179345 filed on Dec. 20, 2022, and 10-2023-0066060 filed on May 23, 2023, in the Korean Intellectual Property Office, the disclosures of each of which are incorporated herein by reference in their entirety.

BACKGROUND

The present disclosure relates to a semiconductor device.

With the advance of semiconductor technology, a stacked semiconductor device, such as 3D integrated circuits (3D-ICs), has emerged as an efficient alternative to further reduce the physical size of the semiconductor device. In the stacked semiconductor device, individual semiconductor devices are stacked vertically on each other and are interconnected to each other using a penetrating connection portion such as a through silicon via (TSV). For example, some of the advantages of the 3D-IC include reducing occupied spaces, reducing power consumption by reducing a length of a signal interconnect portion, and improving yield and manufacturing costs when individual semiconductor devices are tested individually, prior to assembly.

Meanwhile, individual semiconductor devices included in the 3D-IC may include an input/output (I/O) interface cell, which is a function block for interfacing vertical connections.

SUMMARY

An aspect of the present disclosure is to provide a semiconductor device in which an area occupied by an I/O interface cell can be reduced and logic cells can be efficiently disposed.

According to an example embodiment of the present disclosure, a semiconductor device may include a substrate including a Keep-Out Zone (KOZ) and a layout finishing cell region; a through silicon via (TSV) penetrating through the substrate, the TSV being surrounded by the KOZ; an electrostatic discharge (ESD) diode on an upper surface of the substrate; a driver circuit on the upper surface of the substrate; metal wirings configured to electrically connect the TSV, the ESD diode, and the driver circuit; a plurality of first gate structures; and a plurality of second gate structures on the substrate. The layout finishing cell region may surround KOZ and the ESD diode and may be around the TSV. The substrate may include a plurality of first active regions extending in parallel in a first direction from the layout finishing cell region to an outside region. The outside region may be outside the layout finishing cell region. The plurality of first gate structures may extend in a second direction and may intersect the plurality of first active regions. The first direction may be parallel to the upper surface of the substrate and may intersect the second direction. The plurality of second gate structures may extend in parallel in the second direction from the layout finishing cell region to the outside region. The substrate may include a plurality of second active regions extending in the first direction and intersecting the plurality of second gate structures.

According to an example embodiment of the present disclosure, a semiconductor device may include a substrate including a Keep-Out Zone (KOZ) and a layout finishing cell region; a through silicon via (TSV) penetrating through the substrate, the TSV being surrounded by the KOZ; an electrostatic discharge (ESD) diode on an upper surface of the substrate; a driver circuit; a plurality of gate structures on the substrate; and metal wirings configured to electrically connect the TSV, the ESD diode, and the driver circuit. The layout finishing cell region may surround the KOZ and the ESD diode and may be around the TSV. The driver circuit may be adjacent to the layout finishing cell region and outside the layout finishing cell region. The substrate may include a plurality of active regions extending from an end inside the layout finishing cell region. The plurality of gate structures may intersect the plurality of active regions to form semiconductor components. The driver circuit may include at least some of the semiconductor components.

According to an aspect of the present disclosure, a semiconductor device may include a substrate including a plurality of I/O interface cell regions in a form of a closed loop and a standard cell region outside the plurality of I/O interface cell regions; and a plurality of I/O interface cells on the substrate. The plurality of I/O interface cells each may include a through silicon via (TSV), an electrostatic discharge (ESD) diode, a driver circuit, metal wirings, a layout finishing cell region, and a Keep-Out Zone (KOZ) around the TSV. The metal wirings may electrically connect the TSV, the ESD diode and the driver circuit. The layout finishing cell region may surround the ESD diode and the Keep-Out Zone (KOZ) around the TSV. The layout finishing cell region may include an end cap for active regions and gate structures extending from the standard cell region.

A semiconductor device according to an example embodiment of the present disclosure may have a standard cell type I/O interface cell in which logic cells may be adjacent to each other, thereby reducing an area occupied by the I/O interface cell and efficiently disposing the logic cells.

It should be noted that aspects of the present disclosure are not limited to the above-mentioned aspects, and other unmentioned aspects of the present disclosure will be clearly understood by those skilled in the art from the following descriptions.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
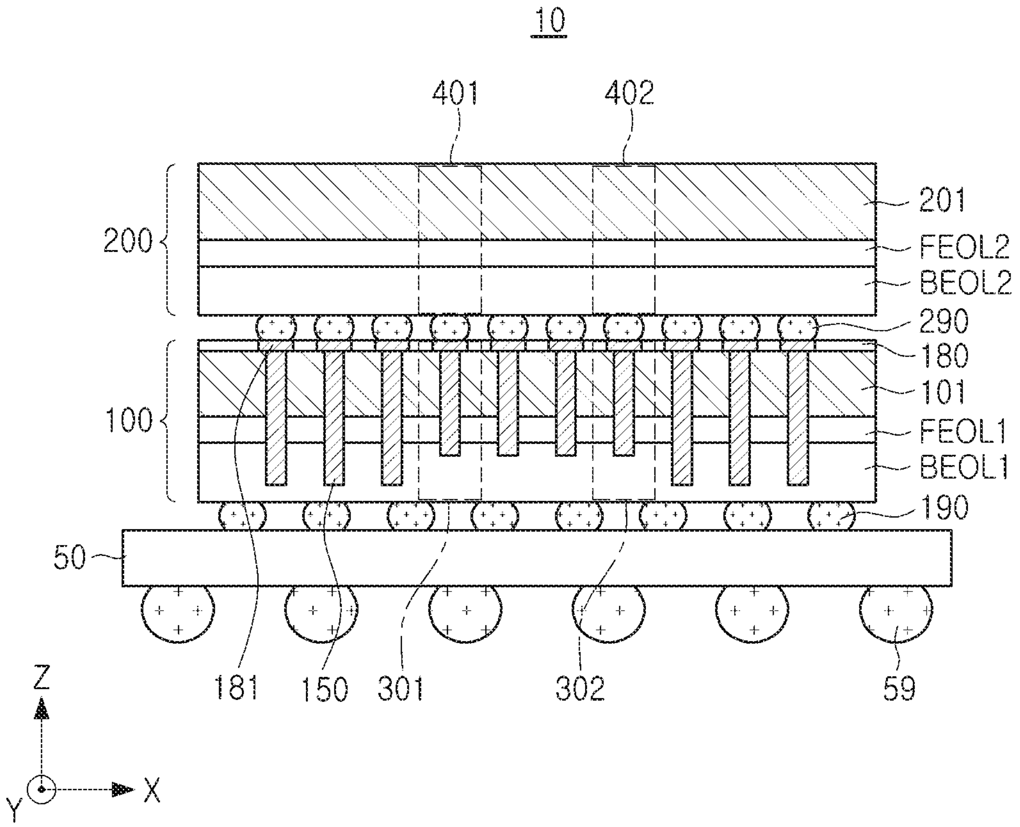
FIGS. 1 and 2 are views illustrating a 3D-IC package according to an example embodiment of the present disclosure.
Figure 2:
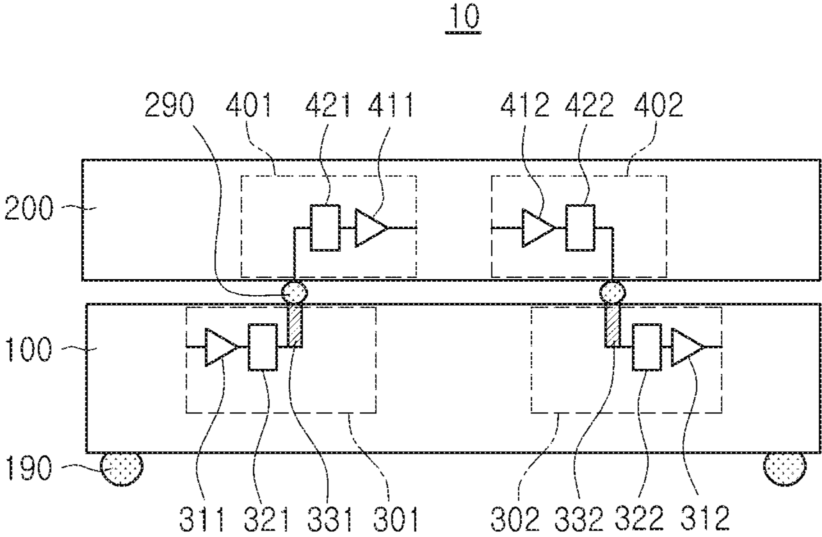

FIGS. 1 and 2 are views illustrating a 3D-IC package according to an example embodiment of the present disclosure. FIG. 1 is a cross-sectional view of the 3D-IC package, and FIG. 2 is a circuit diagram illustrating I/O interface cells of the 3D-IC.

Referring to FIG. 1, a 3D-IC package 10 may include a base substrate 50, a first semiconductor device 100, and a second semiconductor device 200.

For example, the 3D-IC package 10 may be a complete system-in package (SiP). The first semiconductor device 100 may be a general-purpose processor, and the second semiconductor device 200 may be a dynamic random access memory (DRAM), a graphics processor, an audio/video processor, a digital radio receiver, a flash memory, a communication processor, a global positioning satellite (GPS) receiver, a Bluetooth interface, a second processor, a power management unit, or combinations of other communication interfaces used by the 3D-IC package 10. These IC die types are only listed as examples, and the present disclosure does not exclude other types of IC dies.

The first semiconductor device 100 and the second semiconductor device 200 may be stacked on each other. The first semiconductor device 100 disposed on a relatively low layer may be referred to as a bottom die, and the second semiconductor device 200 disposed on a relatively high layer may be referred to as a top die. Each of the first semiconductor device 100 and the second semiconductor device 200 may have a front surface facing an upper surface on which semiconductor components are formed in a substrate and a rear surface facing a lower surface of the substrate. In the example embodiment of FIG. 1, semiconductor devices may be stacked such that the front surface of the first semiconductor device 100 faces the rear surface of the second semiconductor device 200.

The base substrate 50 may mount the first semiconductor device 100 and the second semiconductor device 200 stacked each other. For example, the base substrate 50 may be implemented as a printed circuit board (PCB).

The base substrate 50 may include several layers of conductive materials and insulating materials designed to provide an electrical connection required for the first semiconductor device 100 and the second semiconductor device 200. For example, the base substrate 50 may have conductive materials, such as a ball grid array (BGA) 59, which receive power from the outside and transmit or receive external signals.

The first semiconductor device 100 may be mounted on the base substrate 50 using a process referred to as flip chip bonding. In the flip chip bonding process, the first semiconductor device 100 may be flipped, and a pad formed on the front surface of the first semiconductor device 100 may be aligned with a pad of the base substrate 50. The pads of the first semiconductor device 100 and the base substrate 50 may be connected using a conductive material 190 such as a solder bump.

The first semiconductor device 100 may include a substrate 101, a first component layer FEOL1, a first wiring layer BEOL1, and a bonding metal layer 180.

The first component layer FEOL1 may include semiconductor components deposited or grown on the substrate 101. For example, the semiconductor components may include active components such as transistors or diodes used to process or amplify electrical signals. The first component layer FEOL1 may be formed of various materials such as silicon, germanium, gallium and arsenic, depending on the purpose thereof.

The first wiring layer BEOL1 may include wiring patterns for interconnecting the semiconductor components included in the first component layer FEOL1. For example, each of the first wiring layers BEOL1 may have a plurality of layers including wiring patterns.

The bonding metal layer 180 may include bonding pads 181 for electrical connection with the second semiconductor device 200.

The second semiconductor device 200 may include a substrate 201, a second component layer FEOL2, and a second wiring layer BEOL2. The substrate 201, the second component layer FEOL2, and the second wiring layer BEOL2 may be similar to the substrate 101, the first component layer FEOL1, and the first wiring layer BEOL1.

In order to bond the first semiconductor device 100 to the second semiconductor device 200, the first semiconductor device 100 and the second semiconductor device 200 may be turned upside down, and the pad of the second semiconductor device 200 may be aligned with the bonding pads 181 of the first semiconductor device 100. The pads of the first semiconductor device 100 and the second semiconductor device 200 may be connected using a conductive material 290 such as a microbump.

Meanwhile, the first semiconductor device 100 may include TSVs 150 for providing electrical connections between the first semiconductor device 100 and the second semiconductor device 200. For example, the TSVs 150 may penetrate through the first substrate 101 and the first component layer FEOL1, or may further penetrate through at least a portion of the first wiring layer BEOL1, and may electrically connect wiring patterns formed in the first wiring layer BEOL1 to the bonding pads 181 included in the bonding metal layer 180.

The first semiconductor device 100 and the second semiconductor device 200 may include a plurality of I/O interface cells for interfacing electrical connections through the TSVs 150. For example, each of the I/O interface cells of the first semiconductor device 100 may include one TSV 150. Furthermore, each of the I/O interface cells of the second semiconductor device 200 may be electrically connected to one TSV 150.

The I/O interface cells may include an ESD diode for limiting and/or preventing static electricity that may flow into component layers through the TSV 150 and damage the semiconductor components, and a driving circuit for alleviating attenuation or distortion of signals transmitted through the TSV 150. In FIG. 1, some I/O interface cells 301, 302, 401 and 402 of the I/O interface cells are displayed.

Referring to FIG. 2, a circuit structure of each of the I/O interface cells 301, 302, 401 and 402 in the 3D-IC package 10 is schematically illustrated. A first transmission I/O interface cell 301 may include a transmission driver 311, an ESD diode 321, and a TSV 331. The TSV 331 may correspond to the TSV 150 described with reference to FIG. 1, and may electrically connect the first semiconductor device 100 to the second semiconductor device 200.

The ESD diode 321 may remove static electricity that may flow into the semiconductor components of the first semiconductor device 100 through the TSV 331. For example, in the process of bonding the first semiconductor device 100 and the second semiconductor device 200, when a charged first semiconductor device 100 and a charged second semiconductor device 200 get close, strong static electricity may occur and flow into the semiconductor components, and may damage the semiconductor components. The ESD diode 321 may flow static electricity introduced through the TSV 331 through power or ground.

The transmission driver 311 may transmit signals generated by the semiconductor components to the TSV 331. Despite a strong load capacitance of the TSV 331, the transmission driver 311 may have sufficient driving capability to transmit the signals without distortion.

A first reception I/O interface cell 302 may include a reception driver 312, an ESD diode 322, and a TSV 332. The reception driver 312, the ESD diode 322, and the TSV 332 may have a structure similar to that of the transmission driver 311, the ESD diode 321, and the TSV 331. For example, the reception driver 312 may amplify signals received from the second semiconductor device through the TSV 332 and transmit the signals to the semiconductor components of the first semiconductor device 100.

A second reception I/O interface cell 401 may include a reception driver 411 and an ESD diode 421. Furthermore, a second transmission I/O interface cell 402 may include a transmission driver 412 and an ESD diode 422. The reception driver 411 and the transmission driver 412 may have a structure similar to that of the transmission driver 311 and the reception driver 312. Furthermore, the ESD diodes 421 and 422 may have a structure similar to that of the ESD diodes 321 and 322. Hereinafter, a transmission driver and a reception driver may be referred to as drivers. The drivers each may include a driver circuit.

Meanwhile, the I/O interface cells disposed in the semiconductor device may occupy a larger area than that of general logic cells.

For example, semiconductor components may be disposed in consideration of a Keep-Out Zone (KOZ) defined around a TSV in I/O interface cell regions of the semiconductor device. For example, in order to limit and/or prevent deterioration of the semiconductor components that may be caused by a physical impact generated by causing the TSV to penetrate through a substrate and an component layer of the semiconductor device, the formation of the semiconductor components may be prohibited in a region within a desired and/or alternatively predetermined range from the TSV, and the desired and/or alternatively predetermined region may be referred to as a KOZ.

Furthermore, a driver circuit included in the I/O interface cell may have a structure in which a plurality of unit circuits such as inverters are connected in parallel, in order to transmit signals by limiting and/or minimizing signal distortion despite a large load capacitance of the TSV. Furthermore, the ESD diode included in the I/O interface cell may have a structure in which a plurality of diode circuits are connected in parallel, in order to remove high-voltage static electricity introduced into the TSV.

One I/O interface cell may occupy a relatively large area, and the semiconductor device may include a plurality of I/O interface cells. When the area occupied by individual I/O interface cells in the semiconductor device can be reduced, an entire area of the semiconductor device may be greatly reduced, or more logic cells may be disposed in the semiconductor device of a desired and/or alternatively predetermined area.

According to an example embodiment of the present disclosure, the I/O interface cell may be implemented in a standard cell type. When the I/O interface cell is implemented as a standard cell, it may be adjacent to other logic cells implemented in the standard cell type, thereby reducing the area occupied by the individual I/O interface cells in the semiconductor device and efficiently deploying logic cells.

Hereinafter, before describing an I/O interface cell according to an example embodiment of the present disclosure, an I/O interface cell according to a comparative example different from an example embodiment of the present disclosure will be first described.

Figure 3:
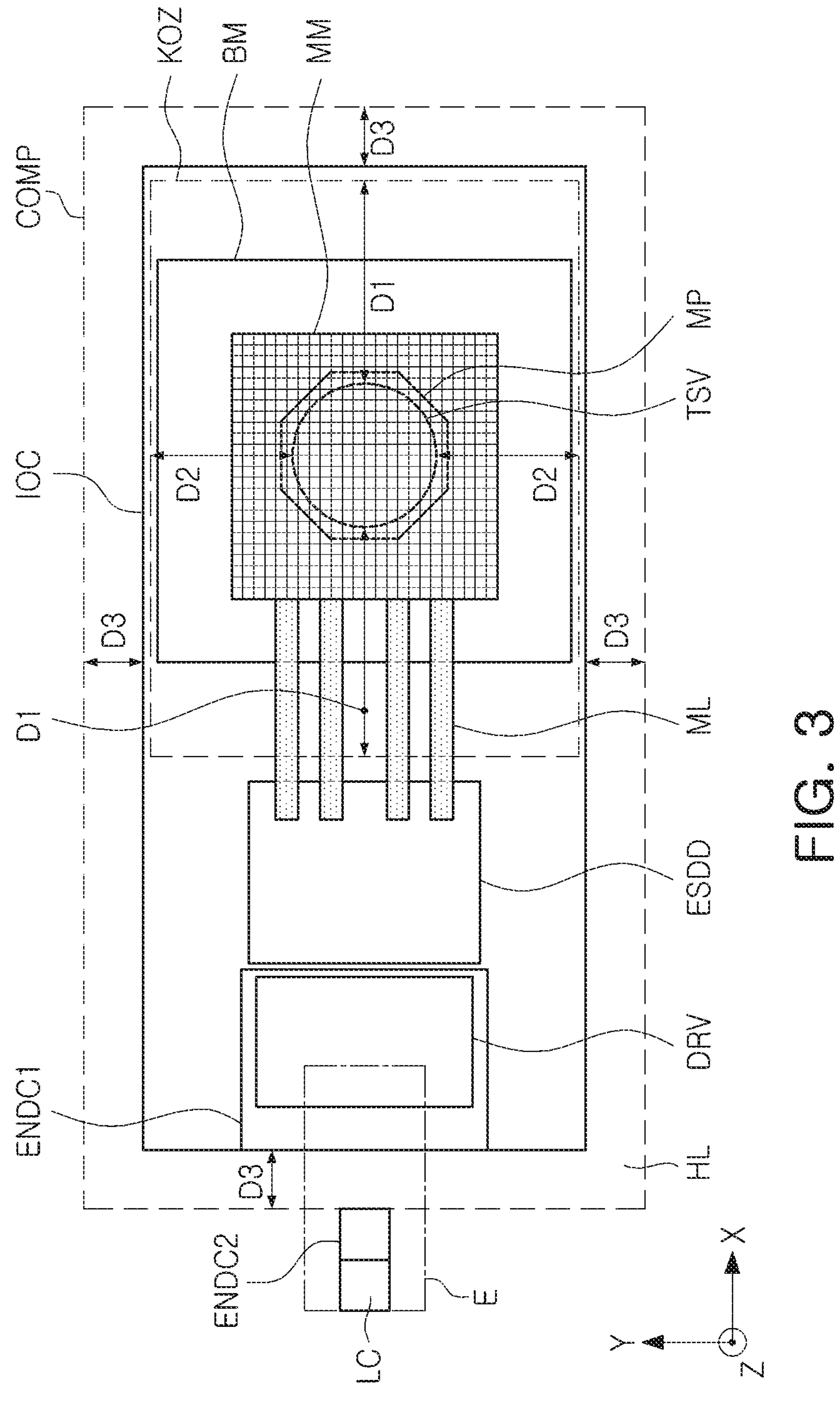
FIG. 3 is a plan view of an I/O interface cell according to a comparative example, different from an example embodiment of the present disclosure.

FIG. 3 is a plan view of an I/O interface cell according to a comparative example different from an example embodiment of the present disclosure.

Referring to FIG. 3, an I/O interface cell IOC and a logic cell LC disposed around the I/O interface cell IOC are illustrated on an X-Y plane. The X-Y plane may refer to a plane in parallel with a component region in which semiconductor components are disposed in the semiconductor substrate.

In the comparative example illustrated in FIG. 3, the I/O interface cell may be implemented in a macro cell type. Macro cells do not have a separate standard for size, and may generally have a larger size than that of standard cells. In order to design a layout, positions of the macro cells in the layout may be determined first, and positions of the standard cells between the macro cells may be determined later.

The I/O interface cell IOC may include an interconnection structure, an ESD diode ESDD, and a driver circuit DRV. The interconnection structure may include a TSV, a metal pad MP, a metal mesh MM, and a bonding metal BM. For example, the TSV may penetrate through at least the substrate and the component region. The bonding metal BM may be connected to a surface of the TSV exposed to a lower surface of the substrate, and the metal pad MP may be connected to a surface of the TSV exposed to an upper surface of the substrate. An upper surface of the metal pad may be electrically connected to a plurality of metal wirings intersecting each other in a plurality of metal layers in a first direction (X-direction) or a second direction (Y-direction). The plurality of metal wirings are schematically illustrated as a metal mesh MM.

A KOZ defined around the TSV is illustrated. For example, the KOZ may be defined as a region within a first distance D1 in the first direction (X-direction) and a second distance D2 in the second direction (Y-direction) from the TSV. As described above, placement of semiconductor devices (e.g., semiconductor components) in KOZ may be prohibited.

The ESD diode ESDD and the driver circuit DRV may be disposed outside the KOZ. The ESD diode ESDD may be electrically connected to the TSV through the metal wiring ML. For example, some of the plurality of metal wirings briefly illustrated as a metal mesh MM may be electrically connected to the metal wiring ML. Although not clearly illustrated in FIG. 3, the ESD diode ESDD and the driver circuit DRV may also be electrically connected to each other through metal wires.

On the other hand, in addition to the area occupied by a KOZ region, the ESD diode ESDD and the driver circuit DRV, the I/O interface cell IOC may occupy an additional area. For example, a first end cap ENDC1 may be disposed inside the I/O interface cell IOC in order to protect the semiconductor components constituting the driver circuit DRV, and a halo region HL may be defined at an edge of the I/O interface cell IOC.

The halo region HL may be a region for separating a macro cell region from a standard cell region. For example, an arrangement of the standard cells may be prohibited in a region within a third distance D3 from the macro cell region. According to the comparative example, an entire region occupied by the I/O interface cell IOC by including the halo region HL is illustrated as a comparative region COMP.

Each of the end caps ENDC1 and ENDC2 may be formed at a boundary of the macro cell region and a boundary of the standard cell region in order to protect each of the semiconductor components disposed at the boundary of the macro cell region and the semiconductor devices disposed at the boundary of the standard cell region. Referring to FIG. 3, not only may the first end cap ENDC1 be disposed inside the I/O interface cell IOC, but also a second end cap ENDC2 may be disposed at the boundary of the halo region. The logic cell LC may be adjacent to the end cap ENDC2.

In short, logic cells may not be disposed in a region in which the halo region HL and the second end cap ENDC2 are disposed around the I/O interface cell IOC.

Figure 4:
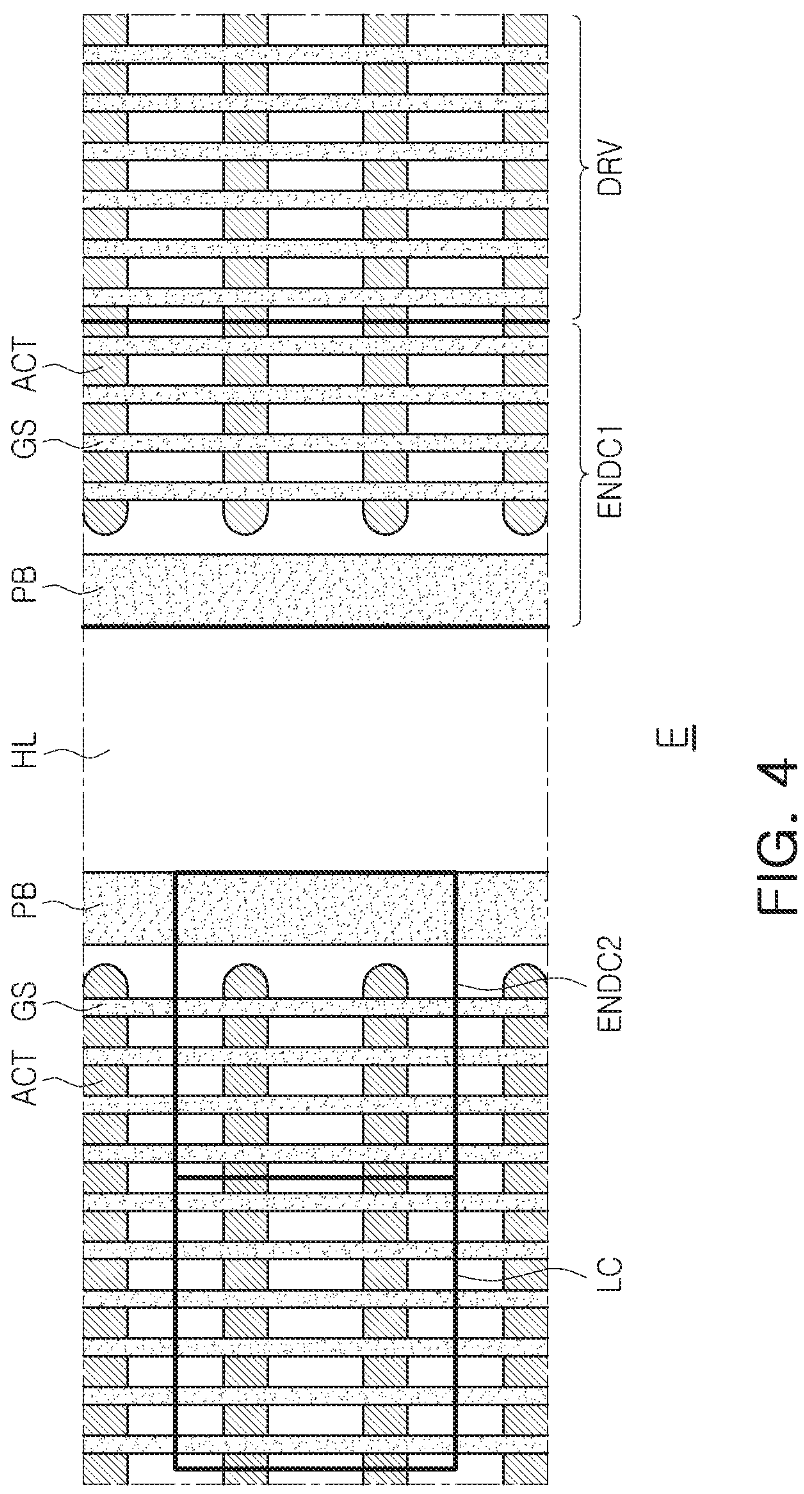
FIG. 4 is an enlarged view of region 'E' of FIG. 3.

FIG. 4 is an enlarged view of region 'E' of FIG. 3.

The 'E' region represents a portion of the comparative region COMP and a standard cell region adjacent thereto. Each of the comparative region COMP and the standard cell region may include a plurality of active regions ACT extending in the first direction (X-direction) and spaced apart from each other in the second direction (Y-direction), and a plurality of gate structures GS extending in the second direction (Y-direction) and spaced apart from each other in the first direction (X-direction). The semiconductor components may be formed by wiring the plurality of active regions ACT and the plurality of gate structures GS.

According to the comparative example in FIGS. 3-4, a plurality of gate structures GS may be formed of polysilicon. The plurality of active regions ACT may be formed to have a fin structure. However, the constituent materials of the plurality of gate structures GSs or the structure of the plurality of active regions ACT are not limited thereto.

On the other hand, there may be defects in the active regions ACT or the gate structures GS disposed at an edge of an I/O interface cell IOC region and an edge of a standard cell region. For example, unlike the gate structures GS disposed inside each region, the gate structures GS disposed at edges of each region may have defects of tilting or collapsing in a manufacturing process of the semiconductor device. Furthermore, in the plurality of active regions ACT, an end disposed at the edges of each region may be formed in a U-shape, and a thickness thereof may not be uniform.

Accordingly, a polysilicon structure PB disposed in parallel with the gate structures GS at the edge of the I/O interface cell IOC region and at the edge of the standard cell region and having a width wider than that of the gate structures GS may be formed in order to limit and/or prevent the gate structures GS from collapsing. Furthermore, in order to limit and/or prevent the deterioration of semiconductor devices, use of semiconductor components in a region in which several to dozens of gate structures GS adjacent to the polysilicon structure PB are formed may be prohibited. A region in which the use of the semiconductor devices is prohibited is illustrated as the first end cap ENDC1 and the second end cap ENDC2.

Semiconductor components may be disposed in an internal region surrounded by the first end cap ENDC1 and the second end cap ENDC2 in each of the I/O interface cell IOCR and the standard cell region. For example, FIG. 3 illustrates a logic cell LC adjacent to the second end cap ENDC2 and a driver circuit DRV adjacent to the first end cap ENDC1.

In the example of FIG. 4, it may be difficult to dispose other logic cells between the driver circuit DRV and the logic cell LC due to the first end cap ENDC1, the second end cap ENDC2, and the halo region HL. When the logic cells cannot be adjacent to each edge of a plurality of I/O interface cells disposed in the semiconductor device, this may lead to waste of an component region of the semiconductor device.

According to an example embodiment of the present disclosure, the I/O interface cell may be implemented in the standard cell type. The fact that the I/O interface cell is implemented in the standard cell type may denote that other standard cells may be adjacent to each other at edges of the I/O interface cell. According to an example embodiment of the present disclosure, the waste of the component region of the semiconductor device may be reduced, and accordingly, an area of the semiconductor device may be reduced or a plurality of semiconductor components may be disposed in the same area. Hereinafter, referring to FIGS. 5 to 13, an I/O interface cell according to an example embodiment of the present disclosure will be described in detail.

Figure 5:
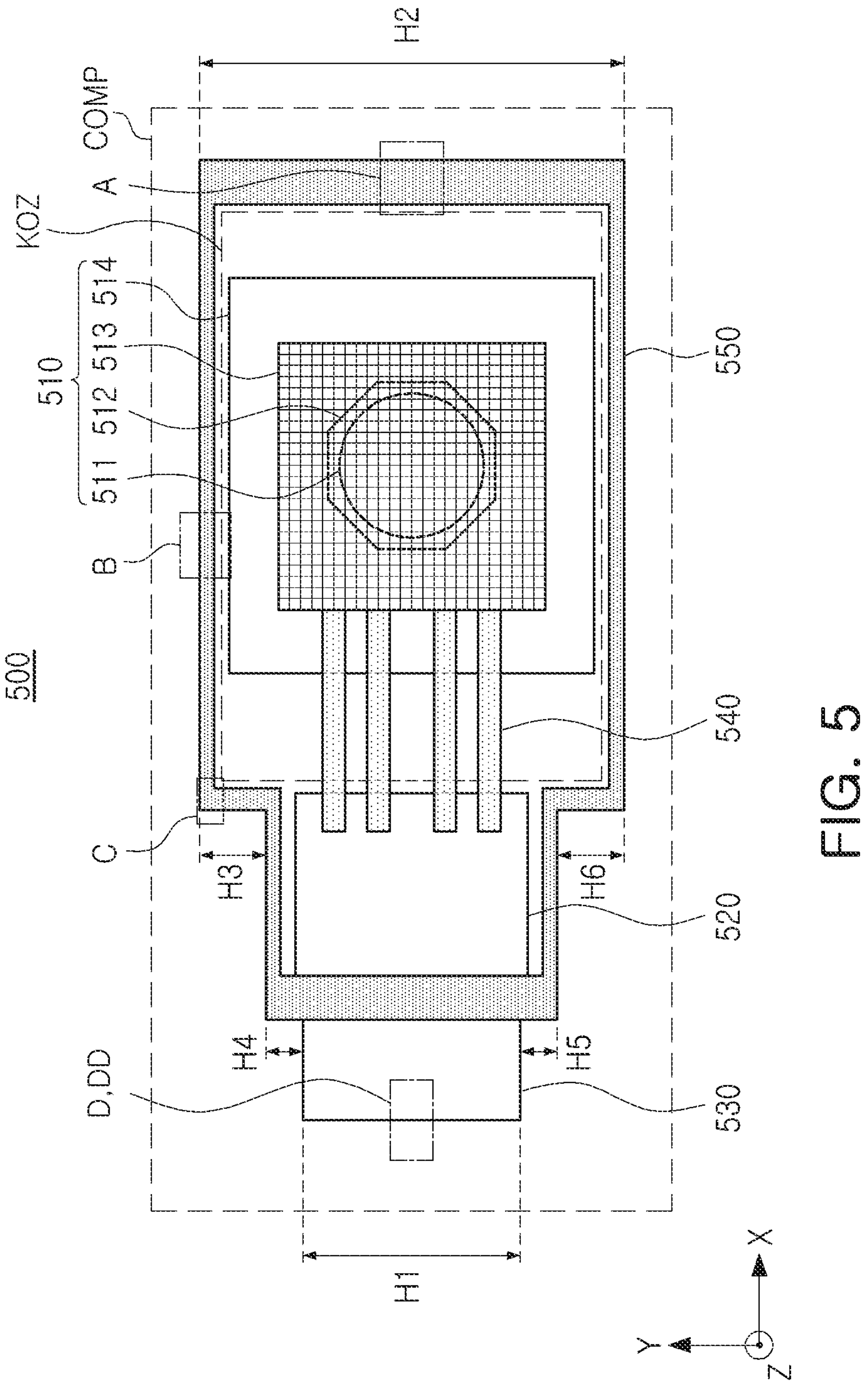
FIG. 5 is a plan view of an I/O interface cell according to an example embodiment of the present disclosure.

FIG. 5 is a plan view of an I/O interface cell according to an example embodiment of the present disclosure.

Referring to FIG. 5, an I/O interface cell 500 disposed on the X-Y plane is illustrated. The I/O interface cell 500 may include an interconnection structure 510, an ESD diode 520, a driver circuit 530, a metal wiring 540, and a layout finishing cell 550.

The interconnection structure 510 may include a TSV 511, a metal pad 512, a metal mesh 513, and a bonding metal 514. The TSV 511, the metal pad 512, the metal mesh 513, and the bonding metal 514 of FIG. 5 may have the same structure as the TSV, the metal pad MP, the metal mesh MM, and the bonding metal BM described with reference to FIG. 3. A KOZ as described with reference to FIG. 3 may be defined around the TSV 511 of FIG. 5.

The driver circuit 530 may have the same structure as that of the driver circuit DRV described with reference to FIG. 3, and the ESD diode 520 and the metal wiring 540 may have the same structure as that of the ESD diode ESDD and the metal wiring ML described with reference to FIG. 3.

According to an example embodiment of the present disclosure, the I/O interface cell 500 may be implemented in the standard cell type. First, a specification of the I/O interface cell 500 may be determined according to a specification defined in the standard cell. For example, each of edges of an I/O interface cell 500 region in the first direction (X-direction) may overlap one of a plurality of power rails defined in the standard cell.

Furthermore, each of lengths H1 to H6 of edges in the second direction (Y-direction) among the edges of the I/O interface cell 500 region may be determined as an integer multiple of a unit height defined in the standard cell. The unit height of the standard cell may be defined as a separation distance between the power rails extending in the first direction (X-direction) and spaced apart from each other in the second direction (Y-direction).

Furthermore, the layout finishing cell 550 surrounding the KOZ and the ESD diode 520 may be defined to have a desired and/or alternatively predetermined width may be disposed such that the standard cells may be adjacent to each other at the edges of the I/O interface cell 500. According to an example embodiment of the present disclosure, gate structures and active regions included in a region of the adjacent standard cells may extend to the layout finishing cell 550 region.

In other words, in the comparative example of FIG. 3, a structure having a shape such as the second end cap ENDC2, which has to be formed at edges of the standard cell region, may not be formed at the edge of the halo region HL, but may be formed in the layout finishing cell 550 region. The layout finishing cell 550 may protect semiconductor components included in the standard cell region by including the end caps for the active regions ACT and the gate structures GS extending from the standard cell region, and the standard cells may be adjacent to the layout finishing cell 550. Accordingly, a separate halo region for distinguishing the I/O interface cell 500 from the standard cells does not need to be defined.

Meanwhile, the layout finishing cell 550 may not surround the driver circuit 530. The driver circuit 530 is a kind of logic block for transmitting a logic signal and may include semiconductor components. According to an example embodiment of the present disclosure, the driver circuit 530 may share the gate structures and the active regions with the adjacent standard cells.

According to an example embodiment of the present disclosure, standard cells may be adjacent to the I/O interface cell 500. In FIG. 5, a comparative region COMP occupied by the I/O interface cell according to the comparative example described with reference to FIG. 3 is illustrated. According to the comparative example, the second end cap ENDC2 may be disposed at the edge of the comparative region COMP, and logic cells may be adjacent to the second end cap ENDC2. However, according to an example embodiment of the present disclosure, the standard cells may be disposed inside the comparative region COMP. Accordingly, the component region of the semiconductor device may be efficiently used.

Hereinafter, an edge region of the I/O interface cell 500 will be described in more detail with reference to FIGS. 6 to 12.

Figure 6:
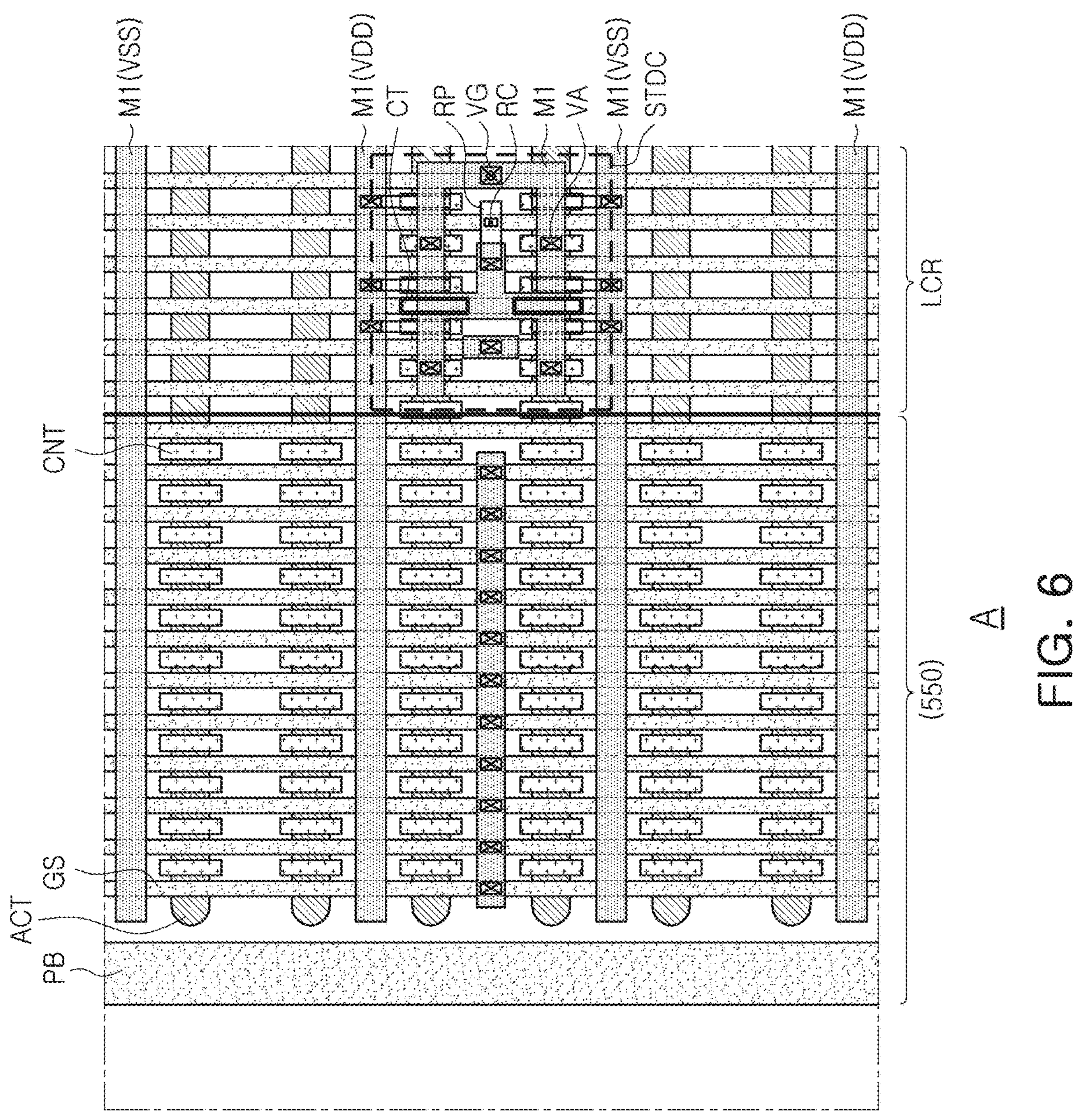
FIG. 6 is an enlarged view of region 'A' of FIG. 5.

FIG. 6 is an enlarged view of region 'A' of FIG. 5.

Region 'A' represents a portion of the layout finishing cell 550 and a logic cell region LCR adjacent to the layout finishing cell 550 in the first direction (X-direction). The logic cell region LCR may refer to a region in which the logic cells implemented in the standard cell type may be disposed.

Region 'A' may include a plurality of active regions ACT extending in the first direction (X-direction) and spaced apart from each other in the second direction (Y-direction), and a plurality of gate structures GS extending in the second direction (Y-direction) and spaced apart from each other in the first direction (X-direction).

Furthermore, region 'A' may include a plurality of power rails extending in the first direction (X-direction) and spaced apart from each other in the second direction (Y-direction). Metal wirings M1 (VDD) for supplying a first power source VSS and metal wirings M1 (VSS) for supplying a source power VSS having a lower potential than that of a drain power VDD are power rails and may be alternately disposed with each other.

According to an example embodiment of the present disclosure, active regions ACT having an end in the layout finishing cell 550 region may extend to the logic cell region LCR in parallel in the first direction (X-direction). Furthermore, the gate structures GS may extend in parallel in the second direction (Y-direction) and intersect the active regions ACT. The gate structures GS may be disposed to be spaced apart from each other at the same interval in the layout finishing cell 550 and the logic cell region LCR. Furthermore, a polysilicon structure PB may be formed adjacently to the ends of the active regions ACT.

The layout finishing cell 550 region may separate an interior of the I/O interface cell 500 from the logic cell region LCR, and may protect the standard cells adjacent to the I/O interface cell 500.

For example, because the ends of the active region ACT extend to the layout finishing cell 550 region, the logic cell region LCR may have only an intermediate portion having a relatively uniform thickness in the active region ACT. Similarly, the polysilicon structure PB and the gate structures GS disposed in the layout finishing cell 550 region may limit and/or prevent the gate structures GS of the logic cell region LCR from tilting or collapsing. Accordingly, the standard cells may be adjacent to the layout finishing cell 550.

FIG. 6 illustrates a standard cell STDC adjacent to the layout finishing cell 550 in the first direction (X-direction). The standard cell STDC may be formed by wiring semiconductor components provided by the active regions ACT and the gate structures GS to the power rails disposed in the logic cell region LCR.

For example, the power rails, the active regions ACT, and the gate structures GS disposed in the logic cell region LCR may be electrically connected to each other by a gate via VG, an active via VA, an intermediate wiring RP, an intermediate contact RC, and a first metal wiring M1, and the gate structures GS extending in the second direction (Y-direction) may be separated into a plurality of gate structures by a cut region CT, thereby forming the standard cell STDC having a plurality of semiconductor components.

The standard cell STDC illustrated in FIG. 6 is merely an example of a standard cell having an arbitrary layout, and any standard cell included in a standard cell library may be adjacent to the layout finishing cell 550.

On the other hand, the layout finishing cell 550 may include dummy structures on the active regions ACT or on the gate structures GS, in order to limit and/or prevent defects that may occur in a semiconductor process such as a chemical mechanical process CMP. For example, the layout finishing cell 550 may include dummy active contacts CNT on the active regions ACT, and dummy gate via VG and a first dummy metal wiring M1. However, semiconductor components performing a substantial function may not be formed in the layout finishing cell 550. That is, structures formed in the layout finishing cell 550 may be electrically floated.

Figure 7:
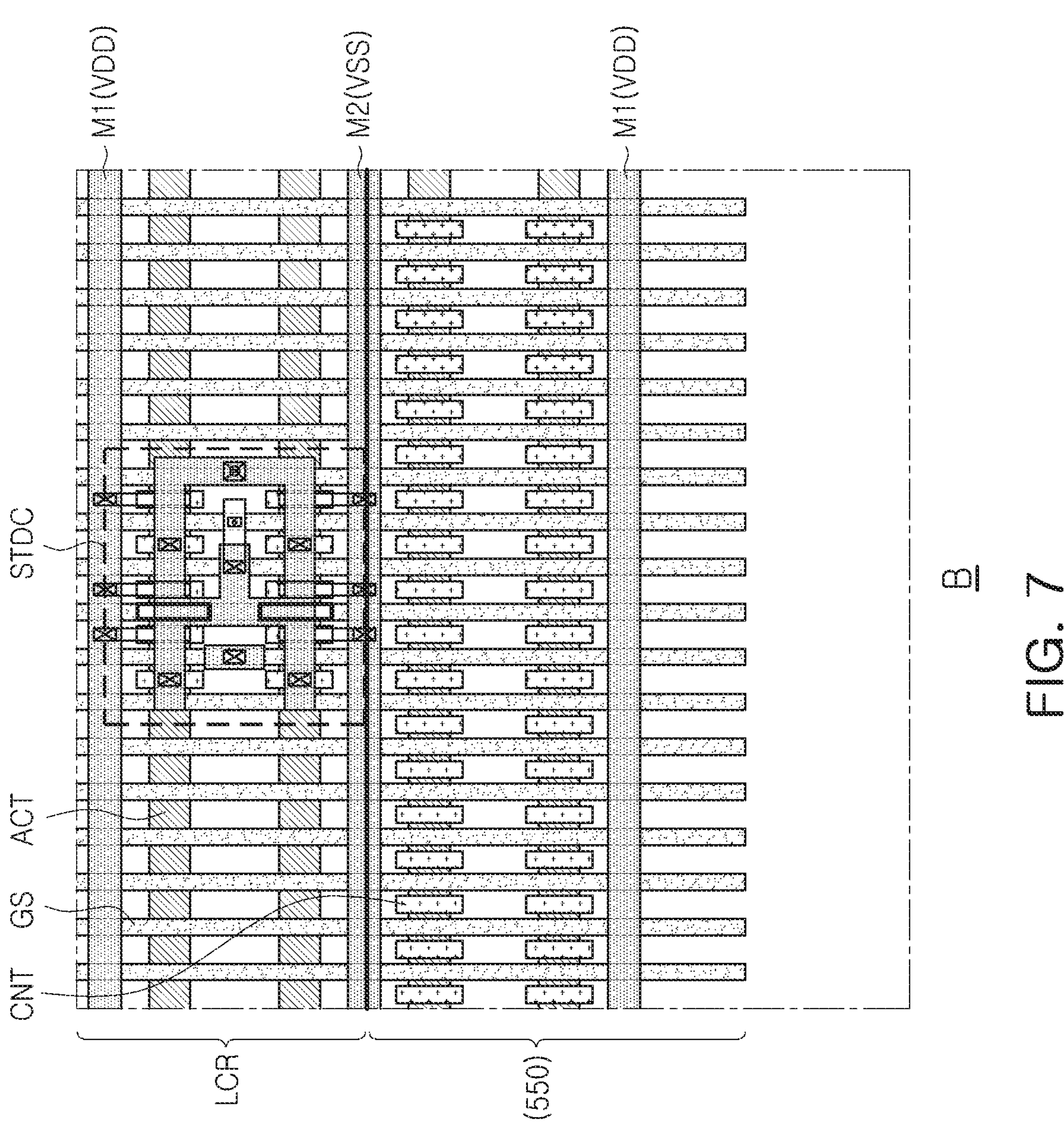
FIG. 7 is an enlarged view of region 'B' of FIG. 5.

FIG. 7 is an enlarged view of region 'B' of FIG. 5.

Region 'B' represents a portion of the layout finishing cell 550 and a logic cell region LCR adjacent to the layout finishing cell 550 in the second direction (Y-direction). Region 'B' may include a plurality of active regions ACT extending in the first direction (X-direction) and spaced apart from each other in the second direction (Y-direction), and a plurality of gate structures GS extending in the second direction (Y-direction) and spaced apart from each other in the first direction (X-direction). Furthermore, region 'A' may include a plurality of power rails extending in the first direction (X-direction) and spaced apart from each other in the second direction (Y-direction).

According to an example embodiment of the present disclosure, the gate structures GS having ends in the layout finishing cell 550 region may extend to the logic cell region LCR in parallel in the second direction (Y-direction). Furthermore, the active regions ACT may extend in parallel in the first direction (X-direction) and intersect the gate structures GS. The active regions ACT may be disposed to be spaced apart from each other at the same interval in the layout finishing cell 550 and the logic cell region LCR.

Similarly to what is described with reference to FIG. 6, the active regions ACT of the logic cell region LCR may be protected by the active regions ACT formed in the layout finishing cell region 550. For example, when the active regions ACT are formed to have a fin structure, the active regions ACT may be limited and/or prevented from tilting or collapsing. Furthermore, because ends of the gate structures GS are disposed in the layout finishing cell 550 region, intermedia portions of the gate structures GS having a relatively uniform thickness may be disposed in the logic cell region LCR.

FIG. 7 illustrates a standard cell STDC adjacent to the layout finishing cell 500 in the second direction (Y-direction). The standard cell STDC may include a plurality of semiconductor components formed by wiring semiconductor components provided by active regions ACT and gate structures GS in the logic cell region LCR to power rails. The standard cell SDDC illustrated in FIG. 7 is merely an example of a standard cell having an arbitrary layout.

Meanwhile, as described with reference to FIG. 6, the layout finishing cell 550 may include dummy structures such as dummy active contacts CNT.

Figure 8:
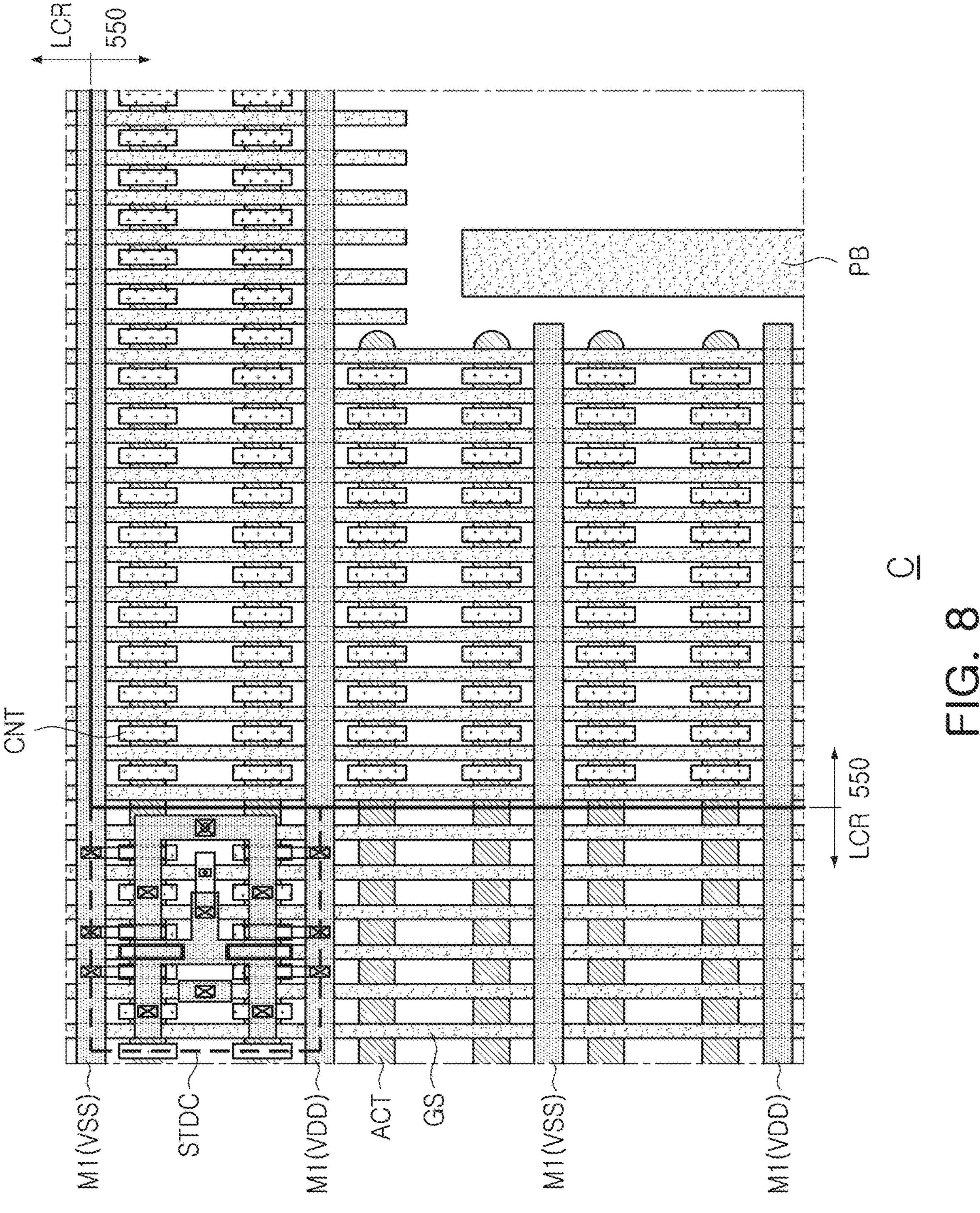
FIG. 8 is an enlarged view of region 'C' of FIG. 5.

FIG. 8 is an enlarged view of region 'C' of FIG. 5.

Region 'C' represents an edge of the layout finishing cell 550 and a logic cell region LCR adjacently to the edge. Region 'C' may include a plurality of active regions ACT extending in the first direction (X-direction) and spaced apart from each other in the second direction (Y-direction), and a plurality of gate structures GS extending in the second direction (Y-direction) and spaced apart from each other in the first direction (X-direction). Furthermore, region 'C' may include a plurality of power rails extending in the first direction (X-direction) and spaced apart from each other in the second direction (Y-direction).

According to an example embodiment of the present disclosure, the active regions ACT of the logic cell region LCR may extend from the first direction (X-direction) to the adjacent layout finishing cell 550. Furthermore, the gate structures GS of the logic cell region LCR may extend to an adjacent layout finishing cell 550 region in the second direction (Y-direction). Furthermore, a polysilicon structure PB may be formed in a direction in parallel with the gate structures GS at a position adjacent to ends of the active regions ACT. Meanwhile, dummy structures such as active contacts CNT may be further formed in the layout finishing cell 550 region.

According to an example embodiment of the present disclosure, a standard cell may be adjacent to an edge of the layout finishing cell 550. FIG. 8 illustrates a standard cell STDC having an arbitrary layout.

According to an example embodiment of the present disclosure with reference to FIGS. 6 to 8, the layout finishing cell 550 region may have active regions ACT and gate structures GS extending from an adjacent logic cell region LCR. The active regions ACT and the gate structures GS extending to the layout finishing cell 550 region may protect active regions ACT and gate structures GS disposed in the logic cell region LCR. Accordingly, the standard cells may be adjacent to the layout finishing cell 550.

Meanwhile, according to an example embodiment of the present disclosure, the layout finishing cell 550 may not surround the driver circuit 530. The layout finishing cell 550 may not be disposed at a boundary between the driver circuit 530 and the logic cell region LCR, and the driver circuit 530 and the logic cell region LCR may be adjacent to each other.

The driver circuit 530 may be a logic block for transmitting a logic signal to the interconnection structure 510, and may be comprised of semiconductor components as in other logic cells. Accordingly, when the driver circuit 530 is implemented in a standard cell type and standard cells are also disposed in the logic cell region LCR, the driver circuit 530 and the logic cell region LCR may be adjacent to each other. Regions 'D' and 'DD' of FIG. 5 represent a region in which the logic cell region LCR and the driver circuit 530 are adjacent to each other in the first direction (X-direction).

Hereinafter, an example of region 'D' will be described with reference to FIGS. 9 and 10, and an example of region 'DD' will be described with reference to FIGS. 11 and 12.

Figure 9:
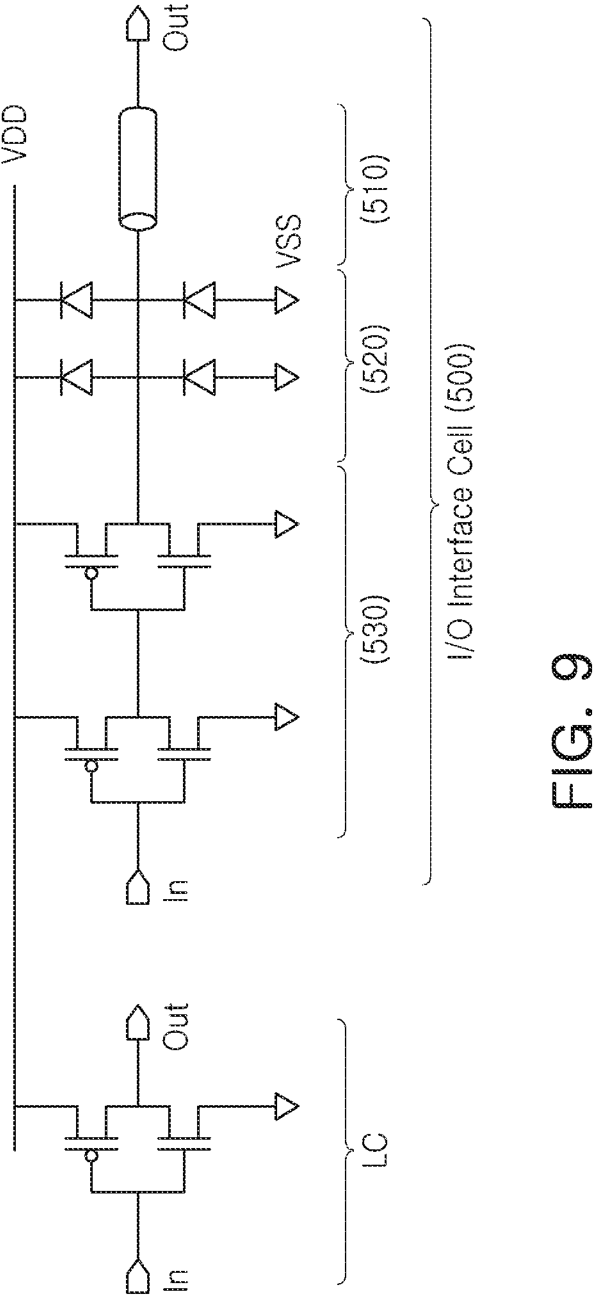
FIG. 9 is a circuit diagram of a semiconductor device according to an example embodiment of the present disclosure.

FIG. 9 is a circuit diagram of a semiconductor device according to an example embodiment of the present disclosure.

The semiconductor device may include an I/O interface cell 500 and a logic cell LC. According to the implementation, the logic cell LC and the I/O interface cell 500 of the semiconductor device may be disposed in the same power domain. The circuit diagram of FIG. 9 illustrates a case in which the logic cell LC and the I/O interface cell 500 share a power source VDD.

When the logic cell LC and the I/O interface cell 500 are disposed in the same power domain, a driver circuit 530 and the logic cell LC adjacent to the driver circuit 530 may share power rails with the active regions ACT and the gate structures GS.

Figure 10:
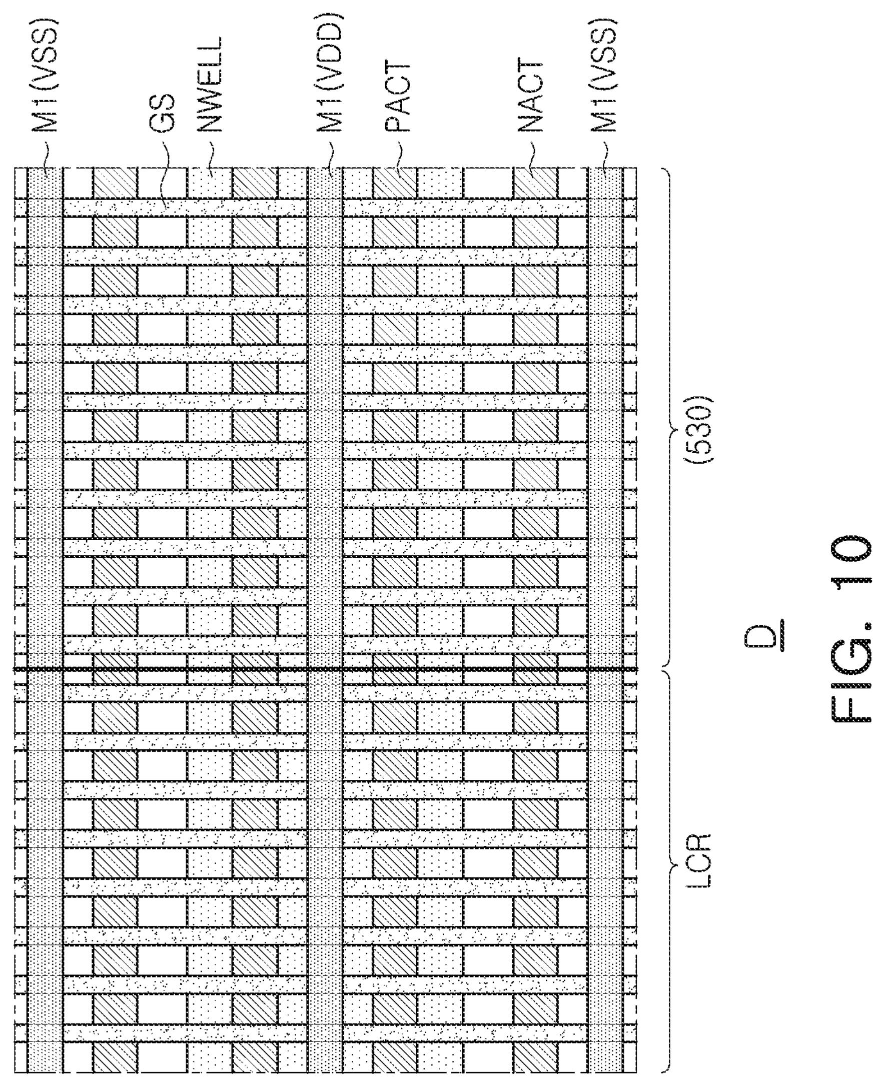
FIG. 10 is an enlarged view illustrating an example of region 'D' of FIG. 5.

FIG. 10 is an enlarged view illustrating an example of region 'D' of FIG. 5. Specifically, FIG. 10 illustrates region 'D' which is the example of region 'D' when the logic cell LC and the I/O interface cell 500 are disposed in the same power domain, as described with reference to FIG. 9.

Referring to FIG. 10, region 'D' represents a portion of a region in which the driver circuit 530 is disposed and a logic cell region LCR is adjacent to the region. Region 'D' may have a plurality of active regions NACT and PACT extending in the first direction (X-direction) and spaced apart from each other in the second direction (Y-direction), and a plurality of gate structures GS extending in the second direction (Y-direction) and spaced apart from each other in the first direction (X-direction).

Meanwhile, the plurality of active regions NACT and PACT extending in the first direction (X-direction) may be active regions extending from the layout finishing cell 550 region adjacent to the driver circuit 530.

Region 'D' may have a plurality of power rails extending in the first direction (X-direction). A metal wiring M1 (VDD) for supplying a drain power VDD and a metal wiring M1 (VSS) for supplying a source power VSS are power rails and may be alternately disposed with each other.

The driver circuit 530 may be formed by wiring first semiconductor components provided by the plurality of active regions NACT and PACT and the gate structures GS to the power rails. Furthermore, the logic cell region LCR may include logic cells formed by wiring second semiconductor components provided by the plurality of active regions NACT and PACT and the gate structures GS to the power rails.

Meanwhile, in FIG. 10, an N-well region NWELL doped with an N-type is further illustrated. In the example of FIG. 10, the semiconductor device may have a P-type substrate, and the N-well region NWELL may be formed by injecting an N-type dopant into a desired and/or alternatively predetermined region of the P-type substrate.

In region 'D,' the active regions NACT doped in the N-type may be provided to a surface of the P-type substrate, and the active regions PACT doped in the P-type may be provided to the surface of the N-well region NWELL. The N-type active regions NACT and the gate structures GS may provide NMOS transistors, and the P-type active regions PACT and gate structures GS may provide PMOS transistors.

The fact that the logic cell region LCR and the driver circuit 530 are disposed in the same power domain may denote that the same drain power VDD is applied to the PMOS transistors constituting the logic cell region LCR and the PMOS transistors constituting the driver circuit 530.

According to an example embodiment of the present disclosure, when the logic cell region LCR and the driver circuit 530 are disposed in the same power domain, the P-type active regions PACT of the logic cell region LCR and the P-type active regions PACT of the driver circuit 530 may be connected to the metal wiring M1 (VDD). Furthermore, the logic cell region LCR and the driver circuit 530 may share the P-type active region PACT formed in the N-well region NWELL with the N-well region NWELL.

When the logic cell region LCR and the driver circuit 530 need to be disposed in different power domains, it may be difficult for the logic cell region LCR and the driver circuit 530 to share the power rails, the N-well region NWELL, and the active region ACT.

Figure 11:
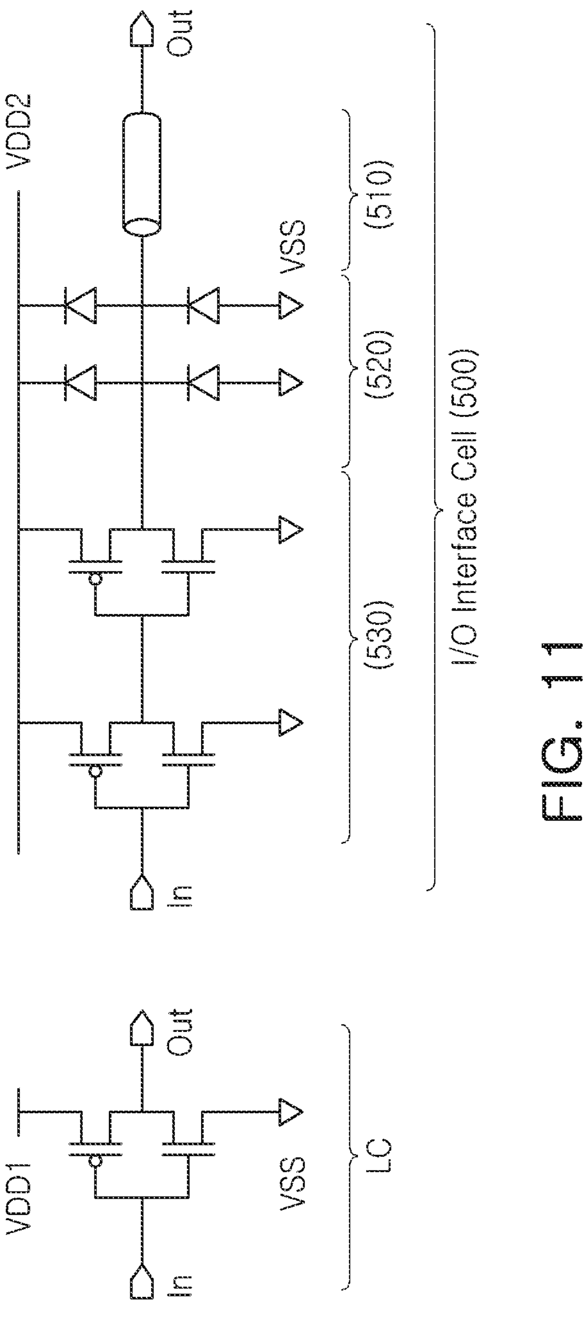
FIG. 11 is a circuit diagram of a semiconductor device according to an example embodiment of the present disclosure.

FIG. 11 is a circuit diagram of a semiconductor device according to an example embodiment of the present disclosure.

The semiconductor device may include an I/O interface cell 500 and a logic cell LC. In the example of FIG. 11, the logic cell LC and the I/O interface cell 500 may be disposed in different power domains. For example, a first drain power VDD1 may be applied to the logic cell LC, and a second drain power VDD2 may be applied to the I/O interface cell 500.

According to an example embodiment of the present disclosure, even when the I/O interface cell 500 and the logic cell LC are disposed in different power domains, the I/O interface cell 500 and the logic cell LC may be adjacent to each other.

Figure 12:
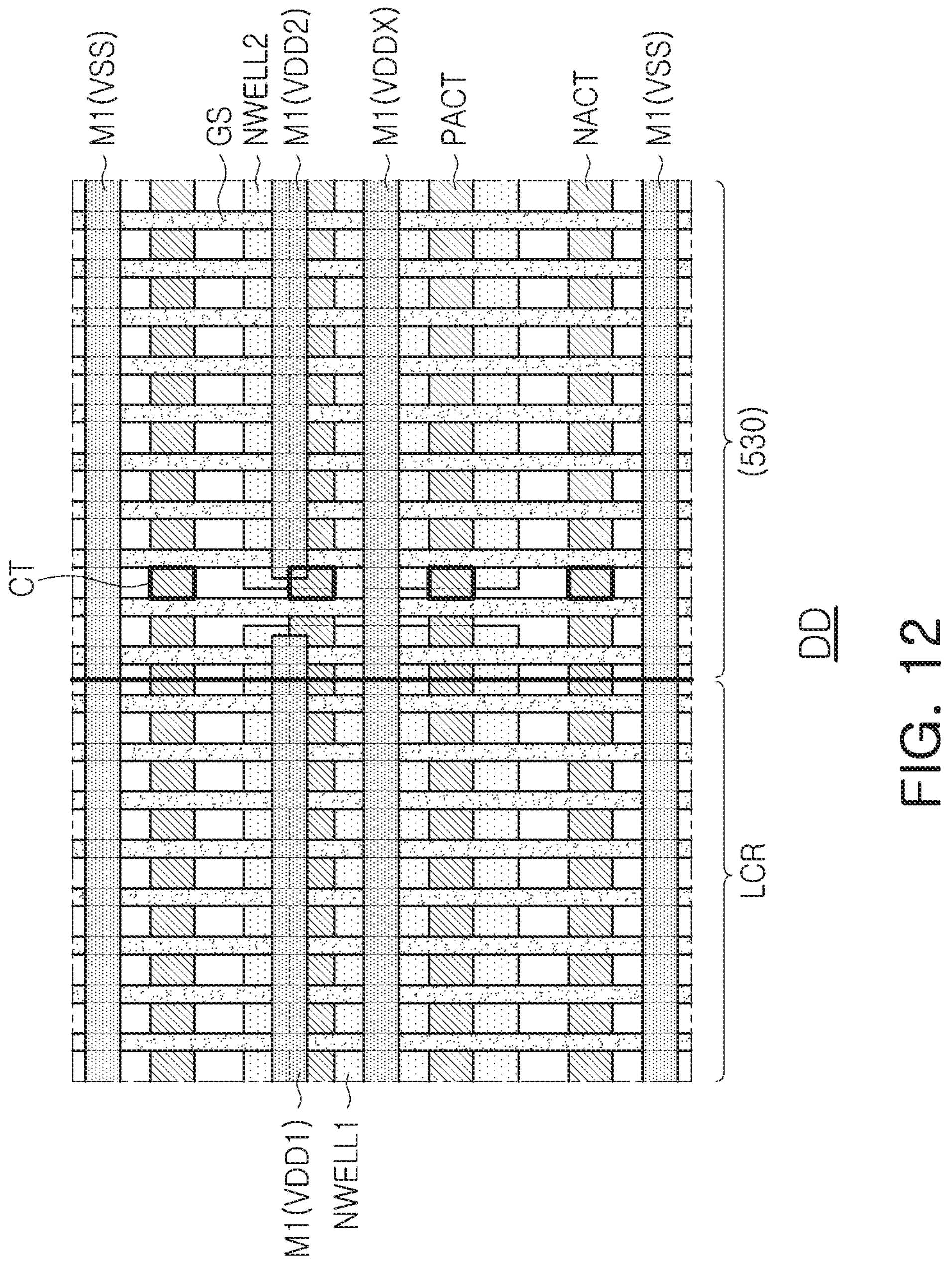
FIG. 12 is an enlarged view illustrating an example of region 'DD' of FIG. 5.

FIG. 12 is an enlarged view illustrating an example of region 'DD' of FIG. 5. Specifically, FIG. 12 illustrates region 'DD' which is an example of region 'DD', where the logic cell LC and the I/O interface cell 500 are disposed in different power domains, as described with reference to FIG. 11.

Referring to FIG. 12, region 'DD' represents a portion of a region in which the driver circuit 530 is disposed, and a logic cell region LCR adjacent to the region. Region 'DD' may include a plurality of active regions NACT and PACT extending in the first direction (X-direction) and spaced apart from each other in the second direction (Y-direction), and a plurality of gate structures GS extending in the second direction (Y-direction) and spaced apart from each other in the first direction (X-direction).

Region 'DD' may have a plurality of power rails extending in the first direction (X-direction). A power rail M1 (VDDX) for supplying a drain power VDDX, and a power rail M1 (VSSX) for supplying a source power VSSX may be alternately disposed with each other. The power rails M1 (VDDX) and M1 (VSSX) may be spaced apart from each other in the second direction (Y-direction) by a unit height according to the specification defined in the standard cell, respectively.

According to an example embodiment of the present disclosure, region 'DD' may further include a first power wiring M1 (VDD1) for supplying a first drain power VDD1, and a second power wiring M1 (VDD2) for supplying a second drain power VDD2, apart from a power rail defined according to the standard cell standard. For example, the first power wiring M1 (VDD1) and the second power wiring M1 (VDD2) may extend in a direction in parallel with the power rails, and may be disposed in a different position from the power rails in the second direction (Y-direction).

The first power wiring M1 (VDD1) may be disposed in the logic cell region LCR and may supply the first drain power VDD1 to semiconductor components formed in the logic cell region LCR. For example, the active regions ACT and the gate structures GS formed in the logic cell region LCR may be wired to the first power wiring M1 (VDD1) and the second power rail M1 (VSSX), thus forming the semiconductor components.

The second power wiring M1 (VDD2) may be disposed in a driver circuit 530 region, and may supply the second drain power VDD2 to the semiconductor components constituting the driver circuit 530. For example, the active regions ACT and the gate structures GS formed in the driver circuit 530 region may be wired to the second power wiring M1 (VDD2) and the second power rail M1 (VSSX), thus forming the semiconductor components.

When the fin structure and the N-well region that constitute the active regions ACT extend across the driver circuit 530 region and the logic cell region LCR, and different power sources VDD1 and VDD2 are applied to the fin structure, a potential difference may adversely affect the performance of the semiconductor device.

According to an example embodiment of the present disclosure, the driver circuit 530 region and the logic cell region LCR may have N-well regions NWELL1 and NEWLL2 that are separated from each other. Furthermore, the fin structure extending across the driver circuit 530 region and the logic cell region LCR may be electrically separated by a cut region. FIG. 12 illustrates a cut region CT formed in fin structures.

According to an example embodiment of the present disclosure, a region for separating a first N-well region NWELL1 and a second N-well NWELL2 may be disposed in the driver circuit 530 region. That is, the first N-well region NWELL1 included in the logic cell region LCR may extend to an interior of the driver circuit 530. Similarly, the cut region CT may also be disposed inside the driver circuit 530 region.

Electrical characteristics may not become uniform at a boundary of the N-well regions NWELL1 and NWELL2 and at a cut surface of the fin structures, and it may be difficult to arrange semiconductor components at the boundary and the cut surface. According to an example embodiment of the present disclosure, because the first N-well region NWELL1 and the fin structure of the logic cell region LCR extend to the interior of the driver circuit 530, the logic cell region LCR may have an N-well region and a fin structure having uniform electrical characteristics such as a thickness. Accordingly, standard cells may be adjacent to the driver circuit 530 region in the logic cell region LCR.

According to the example embodiments of the present disclosure described with reference to FIGS. 5 to 12, the I/O interface cell 500 may be implemented in a standard cell type. Accordingly, standard cell type logic cells may be adjacent to the I/O interface cells 500 in the semiconductor device including the I/O interface cells 500, and a wasted region such as a halo area for distinguishing macro cells from standard cells may be reduced.

Figure 13:
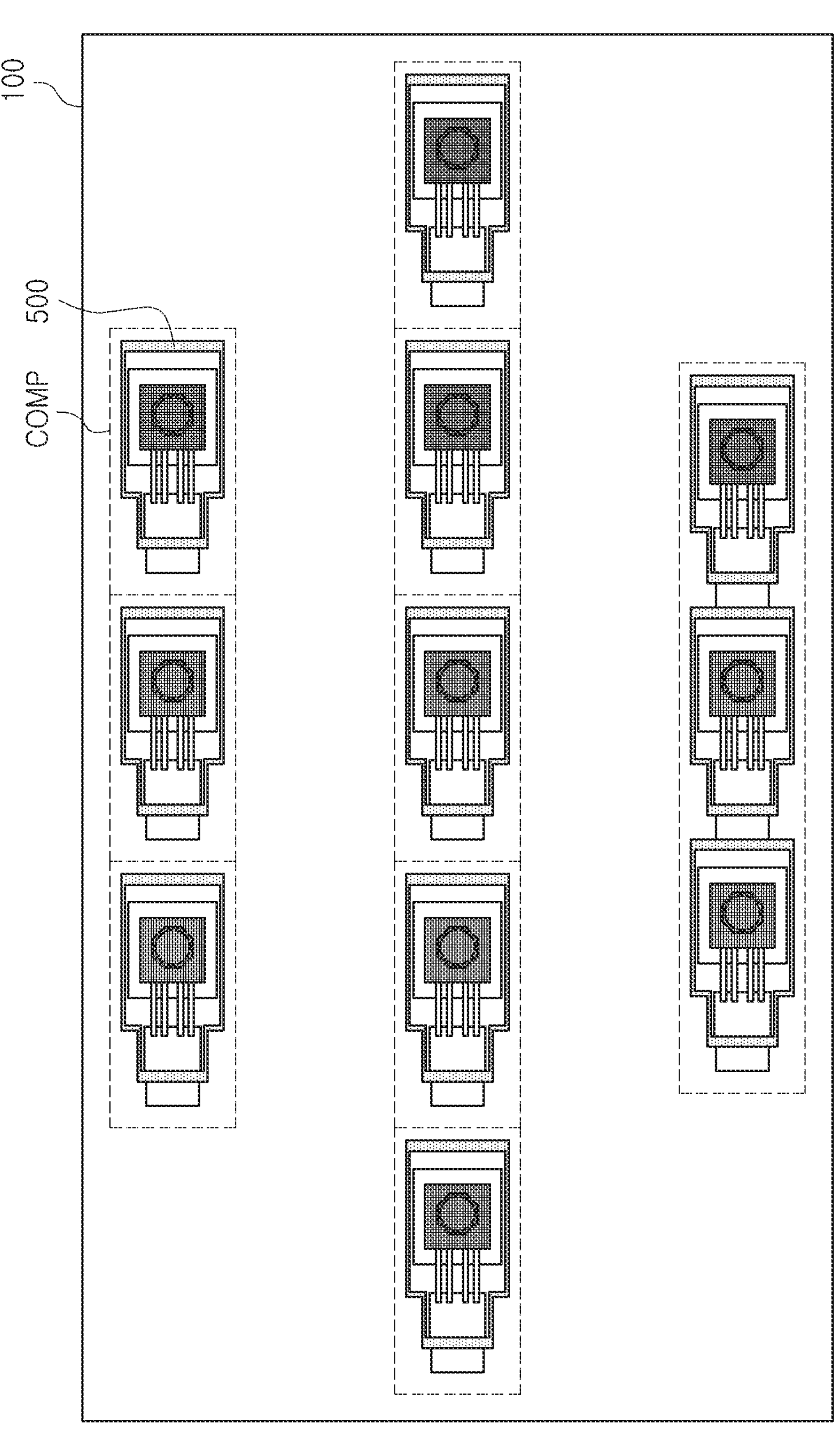
FIG. 13 is a plan view illustrating a semiconductor device according to an example embodiment of the present disclosure.

FIG. 13 is a plan view illustrating a semiconductor device according to an example embodiment of the present disclosure.

Referring to FIG. 13, a plurality of I/O interface cells 500 as described with reference to FIG. 5 may be disposed in the semiconductor device 100. FIG. 13 also illustrates a comparative region COMP as described with reference to FIG. 3 around a plurality of I/O interface cells 500.

According to an example embodiment of the present disclosure, the semiconductor device 100 may include the plurality of I/O interface cells 500, and the logic cells may be adjacent to each of the I/O interface cells 500. According to the comparative example, logic cells may not be disposed in regions illustrated as the comparative region COMP, but according to an example embodiment of the present disclosure, logic cells may also be disposed in regions illustrated as the comparative region COMP.

Furthermore, because the I/O interface cells 500 are implemented in a standard cell type, the I/O interface cells 500 may be adjacent to each other. When the I/O interface cells 500 are adjacent to each other, a remaining region between the I/O interface cells 500 is removed, and a region in which relatively large cells such as macro cells may be disposed be easily secured. Accordingly, various types of cells may be efficiently disposed in the component region of the semiconductor device 100.

Figure 14:
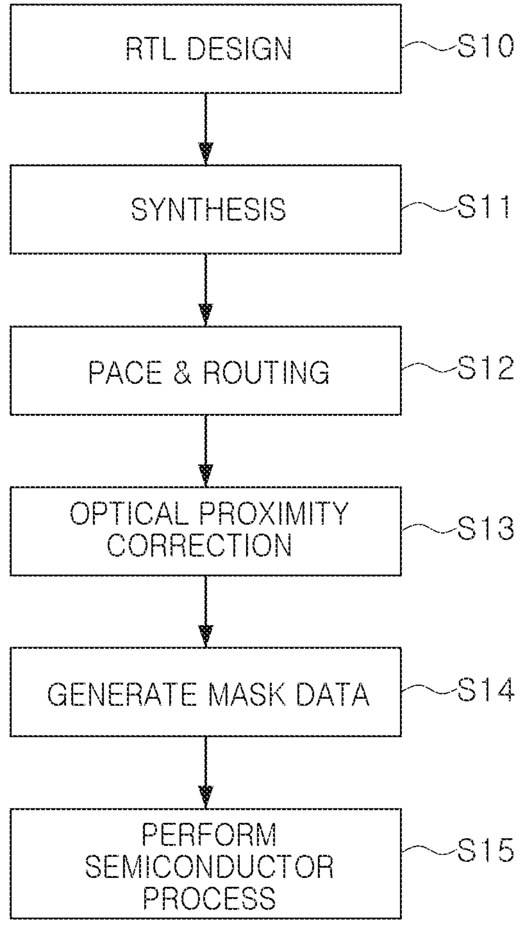
FIG. 14 is a flowchart illustrating a manufacturing method of a semiconductor device according to an example embodiment of the present disclosure.

FIG. 14 is a flowchart illustrating a manufacturing method of a semiconductor device according to an example embodiment of the present disclosure.

Referring to FIG. 14, the manufacturing method of a semiconductor device according to an example embodiment of the present disclosure may start with a register transfer level (RTL) design of operation S10. An RTL code generated by the RTL design may define a function of the semiconductor device. For example, the RTL code may be expressed in languages such as a VHSIC hardware description language (VHDL) and Verilog.

When the RTL code is generated, logical synthesis of generating net list data of the semiconductor device from the RTL code may be performed using standard cells stored in a desired and/or alternatively predetermined library in operation S11. The net list data may include standard cells and data that define a connection relationship between the standard cells, and may be generated by a desired and/or alternatively predetermined semiconductor design tool. The standard cells may provide various circuits such as AND, OR, NOR, an inverter, an Or And Inverter (OAI), an And Or Inverter (AOI), a flip-flop, and a latch.

Then, in operation S12, a place & routing operation of generating layout data by referring to the net list data may be performed. The place & routing operation of step S12 may be performed with reference to the layout of the standard cells stored in the library. A semiconductor design tool that performs the place & routing operation may generate layout data including place information of the standard cells and routing information connecting the arranged standard cells by referring to the netlist data and the library in which the standard cells are stored.

When the place & routing operation is completed, optical proximity correction may be performed on the layout data generated in operation S12. When the optical proximity correction is completed, mask data for forming various patterns on a plurality of layers may be generated in operation S14. After performing exposure to a photoresist using mask data and generating a mask, a semiconductor process using the mask may be performed in operation S15, thereby manufacturing a semiconductor device.

In the place & routing operation, the standard cells may be disposed in standard cell regions, and an empty space between the standard cell regions may be allocated to filler cell regions and may be filled with filler cells. In the routing operation, metal wirings for connecting semiconductor components included in the standard cells to each other may be formed.

In general, in each standard cell, a position of at least some of the metal wirings for connecting the semiconductor components may be predefined and/or set according to a design rule, and for example, metal wirings required for implementing circuits provided by the standard cells may be predefined and/or set according to a design rule. The metal wirings in the standard cells may include an input wiring for receiving input signals from other standard cells, and an output wiring for exporting output signals to other standard cells.

The input wiring and the output wiring included in different standard cells may be connected to each other by other metal wirings disposed above the input wiring and the output wiring. In this case, since a metal wiring for connecting the input wiring and the output wiring is essentially present, restrictions in designing limited metal wirings may increase. Accordingly, the degree of freedom in designing the metal wirings may be reduced, and a length of a routing path for connecting the input wiring and the output wiring may be increased, resulting in a decrease in the electrical characteristics of the semiconductor device.

When connecting a first standard cell and a second standard cell receiving an output signal of the first standard cell as an input signal, an active contact of a filler cell adjacent to the first standard cell and the second standard cell may be used as a wiring. Accordingly, the degree of freedom of design for metal wirings including the input wiring and the output wiring may be improved. Furthermore, a length of a routing path for connecting the first standard cell and the second standard cell may be shortened to improve the electrical characteristics of the semiconductor device.

According to an example embodiment of the present disclosure, an I/O interface cell for interfacing a signal transmitted through a TSV may also be implemented in a standard cell type and may be included in a standard cell library. A layout of the semiconductor device may be designed by referring to the standard cell library, and the I/O interface cell and other standard cells may be designed to be adjacently to each other.

According to an example embodiment of the present disclosure, the I/O interface cell and other standard cells may be adjacent to each other, thereby reducing an area waste of the semiconductor device and efficiently disposing standard cells. Furthermore, a length of the routing path for connecting the I/O interface cell and other standard cells can be shortened, thereby improving the signal transmission performance between the top die and the bottom die in the 3D-IC package.

One or more elements described above may be implemented using processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, a programmable logic unit, a microprocessor, application-specific integrated circuit (ASIC), etc. The processing circuitry may include a memory such as a volatile memory device (e.g., SRAM, DRAM, SDRAM) and/or a non-volatile memory (e.g., flash memory device, phase-change memory, ferroelectric memory device).

The present disclosure is not limited to the above-described embodiments and the accompanying drawings but is defined by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A semiconductor device comprising:

a substrate including a Keep-Out Zone (KOZ) and a layout finishing cell region;

a through silicon via (TSV) penetrating through the substrate, the TSV being surrounded by the KOZ;

an electrostatic discharge (ESD) diode on an upper surface of the substrate;

a driver circuit on the upper surface of the substrate;

metal wirings configured to electrically connect the TSV, the ESD diode, and the driver circuit;

a plurality of first gate structures; and a plurality of second gate structures on the substrate, wherein the layout finishing cell region surrounds KOZ and the ESD diode and is around the TSV, the substrate includes a plurality of first active regions extending in parallel in a first direction from the layout finishing cell region to an outside region, the outside region being outside the layout finishing cell region, the plurality of first gate structures extend in a second direction and intersect the plurality of first active regions, the first direction is parallel to the upper surface of the substrate and intersects the second direction, the plurality of second gate structures extend in parallel in the second direction from the layout finishing cell region to the outside region, and the substrate includes a plurality of second active regions extending in the first direction and intersecting the plurality of second gate structures.

2. The semiconductor device of claim 1, wherein the driver circuit is adjacent to the layout finishing cell region and outside the layout finishing cell region, and the driver circuit includes first semiconductor components provided by the plurality of first gate structures and the plurality of first active regions.

3. The semiconductor device of claim 2, further comprising:

one or more logic cells adjacent to the driver circuit, wherein the one or more logic cells include second semiconductor components provided by the plurality of first gate structures and the plurality of first active regions.

4. The semiconductor device of claim 1, further comprising:

a first logic cell adjacent to the layout finishing cell region, the first logic cell including a first amount of semiconductor components provided by the plurality of first gate structures and the plurality of first active regions; and a second logic cell adjacent to the layout finishing cell region, and the second logic cell including a second amount of semiconductor components provided by the plurality of second gate structures and the plurality of second active regions.

5. The semiconductor device of claim 1, further comprising:

a plurality of power rails extending in the first direction, wherein an edge of the layout finishing cell region is parallel to the first direction and overlaps one of the plurality of power rails.

6. The semiconductor device of claim 1, wherein the layout finishing cell region further comprises dummy structures, wherein the dummy structures are on upper portions of the plurality of first active regions and the plurality of second active regions, or the dummy structures are on the plurality of first gate structures and the plurality of second gate structures.

7. The semiconductor device of claim 6, wherein the dummy structures include active contacts.

8. The semiconductor device of claim 1, further comprising:

a plurality of polysilicon structures between the plurality of first gate structures and the KOZ or the ESD diode inside the layout finishing cell region.

9. A semiconductor device comprising:

a substrate including a Keep-Out Zone (KOZ) and a layout finishing cell region;

a through silicon via (TSV) penetrating through the substrate, the TSV being surrounded by the KOZ;

an electrostatic discharge (ESD) diode on an upper surface of the substrate;

a driver circuit;

a plurality of gate structures on the substrate; and metal wirings configured to electrically connect the TSV, the ESD diode, and the driver circuit, wherein the layout finishing cell region surrounds the KOZ and the ESD diode and is around the TSV, the driver circuit is adjacent to the layout finishing cell region and outside the layout finishing cell region, the substrate includes a plurality of active regions extending from an end in the layout finishing cell region, the plurality of gate structures intersect the plurality of active regions to form semiconductor components, and the driver circuit includes at least some of the semiconductor components.

10. The semiconductor device of claim 9, wherein the substrate includes a standard cell region, and the standard cell region is adjacent to the driver circuit and includes a portion of the semiconductor components provided by the plurality of gate structures intersecting the plurality of active regions.

11. The semiconductor device of claim 10, wherein the driver circuit and the standard cell region are in a same power domain.

12. The semiconductor device of claim 10, further comprising:

a plurality of power rails extending in a direction in parallel with the plurality of active regions, wherein the at least some of the semiconductor components in the driver circuit are electrically connected to the plurality of power rails, the standard cell region includes a logic cell including a portion of the semiconductor components, and the portion of the semiconductor components included in the logic cell are electrically connected to the plurality of power rails.

13. The semiconductor device of claim 10, wherein the driver circuit and the standard cell region are in different power domains.

14. The semiconductor device of claim 10, further comprising:

a drain power rail and a source power rail extending in a direction in parallel with the plurality of active regions, the drain power rail and the source power rail respectively being among a plurality of drain power rails and a plurality of source power rails alternately disposed with each other; and a first power wiring configured to supply a first drain power and a second power wiring configured to supply a second drain power, the first power wiring and the second power wiring both extending in a direction in parallel with the drain power rail and the source power rail, wherein the at least some of the semiconductor components include first semiconductor components, the portion of the semiconductor components includes second semiconductor components, the standard cell region includes logic cells including the second semiconductor components and the second semiconductor components are electrically connected to the first power wiring or the source power rail, the driver circuit includes the first semiconductor components and the first semiconductor components are electrically connected to the second power wiring or the source power rail.

15. The semiconductor device of claim 14, wherein the substrate includes a first N-well region extending from the standard cell region and a second N-well region extending from a region in which the driver circuit is disposed, the plurality of active regions intersect the first N-well region and the second N-well region, the plurality of active regions include a cut region configured to electrically separate the first semiconductor components from the second semiconductor components.

16. The semiconductor device of claim 15, wherein the region in which the driver circuit is disposed includes the cut region and a region for separating the first N-well region from the second N-well region.

17. A semiconductor device comprising:

a substrate including a plurality of I/O interface cell regions in a form of a closed loop and a standard cell region outside the plurality of I/O interface cell regions; and a plurality of I/O interface cells on the substrate, wherein the plurality of I/O interface cells each include a through silicon via (TSV), an electrostatic discharge (ESD) diode, a driver circuit, metal wirings, a layout finishing cell region, and a Keep-Out Zone (KOZ) around the TSV, the metal wirings electrically connect the TSV, the ESD diode and the driver circuit, the layout finishing cell region surrounds the ESD diode and the Keep-Out Zone (KOZ) around the TSV, and the layout finishing cell region includes an end cap for active regions and gate structures extending from the standard cell region.

18. The semiconductor device of claim 17, wherein the plurality of I/O interface cell regions include a plurality of edges in parallel with a direction in which the gate structures extend, and lengths of the plurality of edges are an integral multiple of a unit height defined in a standard cell.

19. The semiconductor device of claim 17, wherein at least some of the plurality of I/O interface cell regions are adjacent to each other.

20. The semiconductor device of claim 17, further comprising:

in the standard cell region, a plurality of logic cells are adjacent to the plurality of I/O interface cell regions.

* * * * *